United States Patent
Ito et al.

(10) Patent No.: US 10,763,801 B2
(45) Date of Patent: Sep. 1, 2020

(54) AMPLIFICATION DEVICE

(71) Applicant: PANASONIC INTELLECTUAL PROPERTY MANAGEMENT CO., LTD., Osaka (JP)

(72) Inventors: Satomi Ito, Osaka (JP); Masaaki Tomoda, Osaka (JP); Yoshifumi Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/440,131

(22) Filed: Jun. 13, 2019

(65) Prior Publication Data

US 2019/0296702 A1 Sep. 26, 2019

Related U.S. Application Data

(63) Continuation of application No. PCT/JP2018/002744, filed on Jan. 29, 2018.

(30) Foreign Application Priority Data

Mar. 31, 2017 (JP) .................................. 2017-071323

(51) Int. Cl.
*H03F 3/217* (2006.01)
*H03F 3/183* (2006.01)
(Continued)

(52) U.S. Cl.
CPC ............... *H03F 3/183* (2013.01); *H03G 3/02* (2013.01); *H03G 3/20* (2013.01); *H04R 3/00* (2013.01)

(58) Field of Classification Search
CPC ...................................................... H03F 3/217
(Continued)

(56) References Cited

U.S. PATENT DOCUMENTS 6,249,322 B1 * 6/2001 Sugihara .................. H04N 5/45
348/634
7,782,400 B2 * 8/2010 Harada ................. G06F 3/0482
348/569
(Continued)

FOREIGN PATENT DOCUMENTS

JP 56-169405 A 12/1981
JP 8-316750 A 11/1996
(Continued)

OTHER PUBLICATIONS

The Extended European Search Report dated Jan. 24, 2020 for the related European Patent Application No. 18775268.8.

*Primary Examiner* — Henry Choe
(74) *Attorney, Agent, or Firm* — McDermott Will & Emery LLP

(57) ABSTRACT

An amplification device is configured to operate such that when a first amplifier function is switched to a second amplifier function (S13) and then the second amplifier function is switched to the first amplifier function (S15) and at this time a state of an operating member is a state corresponding to a second sound volume larger than a first sound volume that was output right before switching from the first amplifier function to the second amplifier function (S16), the amplification device causes the state of the operating member to change to a state corresponding to a third sound volume smaller than the second sound volume (S17), and controls an amplifying operation of a signal processing circuit to cause it to output the third sound volume (S18).

7 Claims, 7 Drawing Sheets

(51) Int. Cl.
*H03G 3/20* (2006.01)
*H03G 3/02* (2006.01)
*H04R 3/00* (2006.01)

(58) Field of Classification Search
USPC .............................................. 330/251, 207 A
See application file for complete search history.

(56) References Cited

U.S. PATENT DOCUMENTS

| 2006/0020355 A1* | 1/2006 | Kano | .................... | G08C 17/00 |
| | | | | 700/94 |
| 2006/0020356 A1* | 1/2006 | Kano | .................. | H04N 21/435 |
| | | | | 700/94 |
| 2018/0189025 A1* | 7/2018 | Tanaka | .................... | G06F 3/165 |

FOREIGN PATENT DOCUMENTS

| JP | 2007-166557 A | 6/2007 |
| JP | 2008-053985 A | 3/2008 |

\* cited by examiner

FIG. 4

| Vol | STEP | A/D VALUE | Vol | STEP | A/D VALUE | Vol | STEP | A/D VALUE | Vol | STEP | A/D VALUE |
|---|---|---|---|---|---|---|---|---|---|---|---|
|  |  |  | 32 | 32 | 330 - 339 | 64 | 64 | 650 - 659 | 96 | 96 | 970 - 979 |
|  |  |  | 33 | 33 | 340 - 349 | 65 | 65 | 660 - 669 | 97 | 97 | 980 - 989 |
|  |  |  | 34 | 34 | 350 - 359 | 66 | 66 | 670 - 679 | 98 | 98 | 990 - 999 |
| 0 | 0 | 0 - 19 | 35 | 35 | 360 - 369 | 67 | 67 | 680 - 689 | 99 | 99 | 1000 - 1009 |
| 1 | 1 | 20 - 29 | 36 | 36 | 370 - 379 | 68 | 68 | 690 - 699 | 100 | 100 | 1010 - 1019 |
| 2 | 2 | 30 - 39 | 37 | 37 | 380 - 389 | 69 | 69 | 700 - 709 |  | 101 | 1020 - 1023 |
| 3 | 3 | 40 - 49 | 38 | 38 | 390 - 399 | 70 | 70 | 710 - 719 |  |  |  |
| 4 | 4 | 50 - 59 | 39 | 39 | 400 - 409 | 71 | 71 | 720 - 729 |  |  |  |
| 5 | 5 | 60 - 69 | 40 | 40 | 410 - 419 | 72 | 72 | 730 - 739 |  |  |  |
| 6 | 6 | 70 - 79 | 41 | 41 | 420 - 429 | 73 | 73 | 740 - 749 |  |  |  |
| 7 | 7 | 80 - 89 | 42 | 42 | 430 - 439 | 74 | 74 | 750 - 759 |  |  |  |
| 8 | 8 | 90 - 99 | 43 | 43 | 440 - 449 | 75 | 75 | 760 - 769 |  |  |  |
| 9 | 9 | 100 - 109 | 44 | 44 | 450 - 459 | 76 | 76 | 770 - 779 |  |  |  |
| 10 | 10 | 110 - 119 | 45 | 45 | 460 - 469 | 77 | 77 | 780 - 789 |  |  |  |
| 11 | 11 | 120 - 129 | 46 | 46 | 470 - 479 | 78 | 78 | 790 - 799 |  |  |  |
| 12 | 12 | 130 - 139 | 47 | 47 | 480 - 489 | 79 | 79 | 800 - 809 |  |  |  |
| 13 | 13 | 140 - 149 | 48 | 48 | 490 - 499 | 80 | 80 | 810 - 819 |  |  |  |
| 14 | 14 | 150 - 159 | 49 | 49 | 500 - 509 | 81 | 81 | 820 - 829 |  |  |  |
| 15 | 15 | 160 - 169 | 50 | 50 | 510 - 519 | 82 | 82 | 830 - 839 |  |  |  |
| 16 | 16 | 170 - 179 | 51 | 51 | 520 - 529 | 83 | 83 | 840 - 849 |  |  |  |
| 17 | 17 | 180 - 189 | 52 | 52 | 530 - 539 | 84 | 84 | 850 - 859 |  |  |  |
| 18 | 18 | 190 - 199 | 53 | 53 | 540 - 549 | 85 | 85 | 860 - 869 |  |  |  |
| 19 | 19 | 200 - 209 | 54 | 54 | 550 - 559 | 86 | 86 | 870 - 879 |  |  |  |
| 20 | 20 | 210 - 219 | 55 | 55 | 560 - 569 | 87 | 87 | 880 - 889 |  |  |  |
| 21 | 21 | 220 - 229 | 56 | 56 | 570 - 579 | 88 | 88 | 890 - 899 |  |  |  |
| 22 | 22 | 230 - 239 | 57 | 57 | 580 - 589 | 89 | 89 | 900 - 909 |  |  |  |
| 23 | 23 | 240 - 249 | 58 | 58 | 590 - 599 | 90 | 90 | 910 - 919 |  |  |  |
| 24 | 24 | 250 - 259 | 59 | 59 | 600 - 609 | 91 | 91 | 920 - 929 |  |  |  |
| 25 | 25 | 260 - 269 | 60 | 60 | 610 - 619 | 92 | 92 | 930 - 939 |  |  |  |
| 26 | 26 | 270 - 279 | 61 | 61 | 620 - 629 | 93 | 93 | 940 - 949 |  |  |  |
| 27 | 27 | 280 - 289 | 62 | 62 | 630 - 639 | 94 | 94 | 950 - 959 |  |  |  |
| 28 | 28 | 290 - 299 | 63 | 63 | 640 - 649 | 95 | 95 | 960 - 969 |  |  |  |
| 29 | 29 | 300 - 309 |  |  |  |  |  |  |  |  |  |
| 30 | 30 | 310 - 319 |  |  |  |  |  |  |  |  |  |
| 31 | 31 | 320 - 329 |  |  |  |  |  |  |  |  |  |

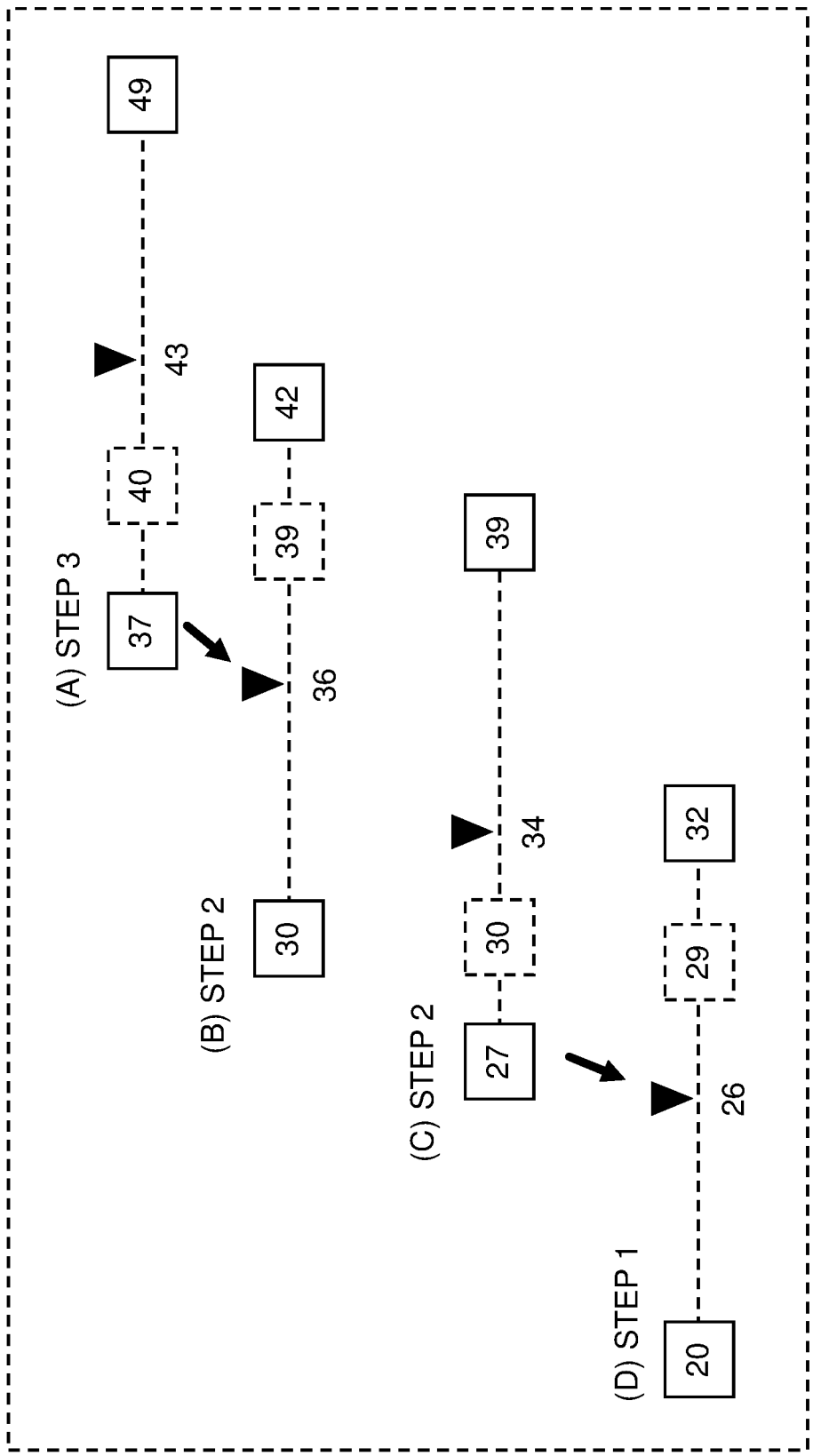

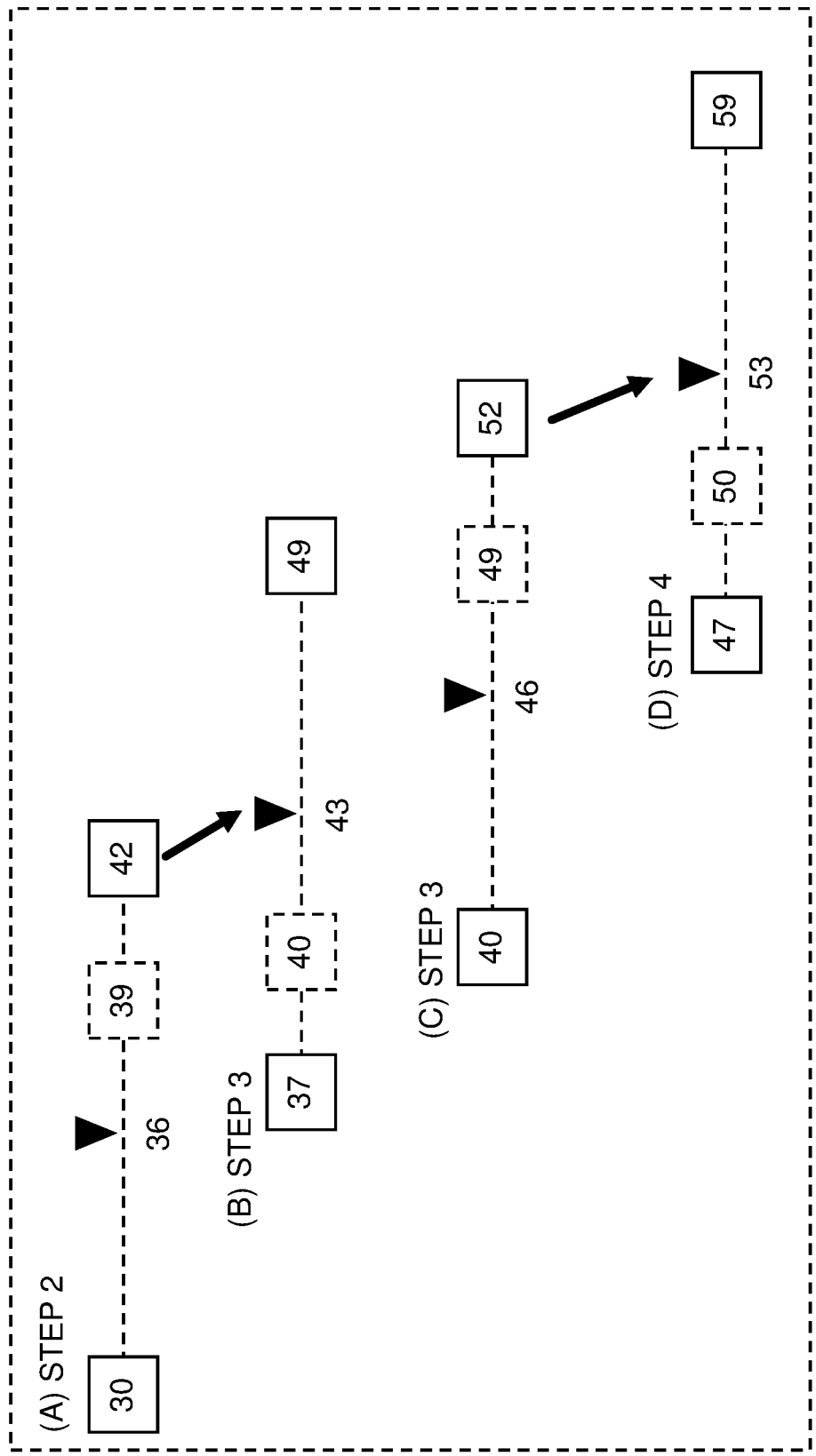

AMPLIFICATION DEVICE

CROSS-REFERENCE OF RELATED APPLICATIONS

This application is a U.S. Continuation of International Patent Application No. PCT/JP2018/002744, filed on Jan. 29, 2018, which in turn claims the benefit of Japanese Application No. 2017-071323, filed on Mar. 31, 2017, the entire disclosures of which Applications are incorporated by reference herein.

TECHNICAL FIELD

The present disclosure relates to an amplification device configured to switch between an amplifier function that allows sound volume adjustment and an amplifier function that does not allow sound volume adjustment.

BACKGROUND ART

Unexamined Japanese Patent Publication No. 2007-166557 (PTL 1) discloses an audio device that includes a plurality of external input terminals, an input switching means, a sound volume setting means, and a sound volume storage means. The input switching means selects one of incoming sound signals from the plurality of external input terminals and inputs the selected sound signal to an amplifier. The sound volume setting means is subjected to an external operation and increases or decreases a sound volume according to the operation. The sound volume storage means stores a sound volume for each incoming sound signal from each of the external input terminal. This audio device is configured to operate such that when the input switching means selects a sound signal to be input to the amplifier as a result of sound signal switching, causes an audio speaker to emit a sound with a stored sound volume corresponding to the sound signal. This allows setting a sound volume for each external input terminal. Therefore, when sound volume levels of sound signals input to the external input terminals vary, for example, a sound signal can be reproduced as a sound with the same sound volume even if one external input terminal is switched to another external input terminal. Furthermore, when a user desires to reproduce each sound signal as a sound with an individual sound volume, the user does not have to reset a sound volume every time the external input terminal is switched.

SUMMARY OF THE INVENTION

An amplification device configured to switch between a first amplifier function that allows sound volume adjustment and a second amplifier function that does not allow sound volume adjustment has a specific case where an amplifier function is switched, a sound with an unintended sound volume is emitted.

The present disclosure provides an amplification device configured to switch an amplifier function, the amplification device preventing emission of a sound with an unintended sound volume when the amplifier function is switched.

The amplification device according to the present disclosure is the amplification device configured to switch between a first amplifier function that allows sound volume adjustment and a second amplifier function that does not allow sound volume adjustment. The amplification device includes an operating member that receives setting of a sound volume, the operating member having a state changed according to the sound volume, a signal processing circuit that amplifies an incoming sound signal so that the sound volume set at the operating member can be obtained, and a controller that controls the signal processing circuit.

During execution of the first amplifier function, the controller controls an amplifying operation of the signal processing circuit so that the sound volume set at the operating member can be obtained. The controller is configured to operate such that when the first amplifier function is switched to the second amplifier function and then the second amplifier function is switched to the first amplifier function and at this time the state of the operating member is the state corresponding to a second sound volume larger than a first sound volume that was output right before switching from the first amplifier function to the second amplifier function, the controller changes the state of the operating member to a state corresponding to a third sound volume smaller than the second sound volume, and controls the amplifying operation of the signal processing circuit to cause the signal processing circuit to output the third sound volume.

BRIEF DESCRIPTION OF THE DRAWINGS

FIG. 4 depicts an example of a table that is referred to when a sound volume set value is determined according to a volume position.

FIG. 6 is a diagram for explaining hysteresis to an A/D value range that occurs when an operation for reducing a sound volume is carried out.

FIG. 7 is a diagram for explaining hysteresis to an A/D value range that occurs when an operation for increasing a sound volume is carried out.

DESCRIPTION OF EMBODIMENTS

Exemplary embodiments will now be described in detail, with reference to drawings being made properly. However, an unnecessarily detailed description may be omitted. For example, a detailed description of well-known matters or a duplicate description of substantially identical configurations may be omitted. This is to avoid unnecessary redundancy in the following description and to facilitate understanding of those skilled in the art.

The inventors provide the accompanying drawings and the following description to help those skilled in the art sufficiently understand the present disclosure, and therefore have no intention to put any limitation by those drawings and description on subject matters described in claims

[1-1. Configuration]

Figure 1:
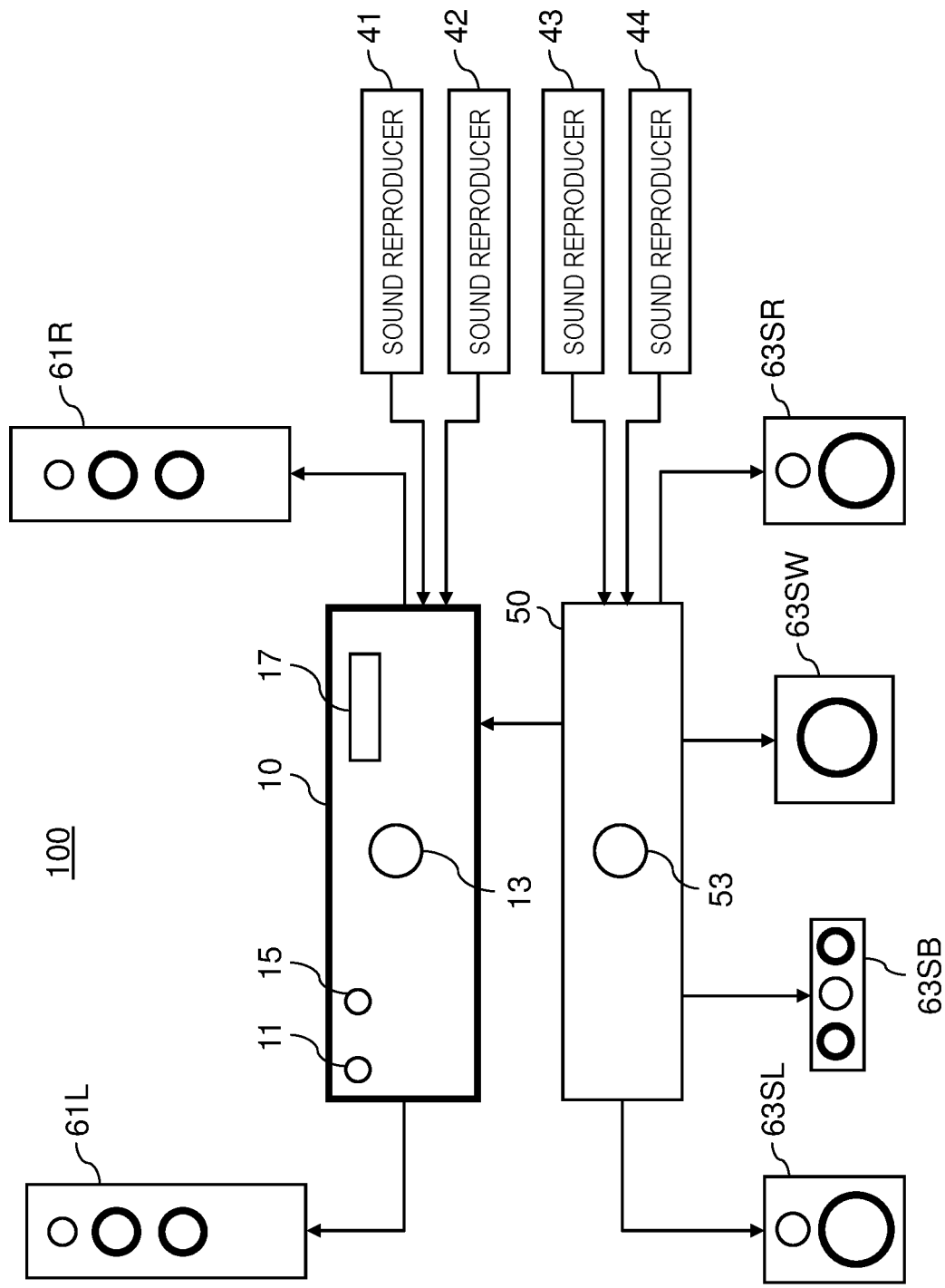
FIG. 1 is an overall configuration diagram of an audio system according to the present disclosure.

FIG. 1 is an overall configuration diagram of an audio system according to an exemplary embodiment of the present disclosure. Audio system 100 includes audio amplifier 10, speakers 61L, 61R connected to audio amplifier 10, audio visual (AV) selector 50, and speakers 63SL, 63SR, 63SB, 63SW connected to AV selector 50. Audio system 100 further includes sound reproducers 41, 42 connected to audio amplifier 10, and sound reproducers 43, 44 connected to AV selector 50.

AV selector 50 is a device that selects one sound reproducer from a plurality of sound reproducers (e.g., sound reproducers 43, 44) serving as sound sources and that outputs a sound signal from the selected sound reproducer, i.e., sound source to external equipment (e.g., audio amplifier 10). AV selector 50 amplifies an incoming sound signal and outputs the amplified sound signal to external equipment. AV selector 50 also has a function of outputting a sound signal based on an incoming sound signal to speakers 63SL, 63SR, 63SB, 63SW.

Sound reproducers 41 to 44 are an example of sound sources. Sound reproducers 41 to 44 are devices that reproduce sound signals from a recording medium, such as an optical disc, a hard disc, and a memory card, to output the reproduced sound signals. In another case, sound reproducers 41 to 44 may be devices that acquire sound data through a network to output the acquired sound data as sound signals. For example, sound reproducers 41 to 44 are compact disc (CD) players, Blu-ray (registered trademark) disc players, i.e., BD players, record players, network audio players, tuners, smart phones, or the like.

Audio amplifier 10 is a device that amplifies a sound signal and that outputs a sound corresponding to the amplified sound signal from speakers 61L and 61R. Audio amplifier 10 can function as a pre-amplifier, a main amplifier (i.e., power amplifier), and a pre-main amplifier. A pre-amplifier function and a pre-main amplifier function are examples of a first amplifier function that allows sound volume adjustment. A main amplifier function is an example of a second amplifier function that does not allow sound volume adjustment.

Audio amplifier 10 includes power switch 11, input selector 15, volume-control knob 13, and display 17. Power switch 11 is a switch for switching on and off a power supply to audio amplifier 10.

Input selector 15 is a switch for switching sound sources for sounds emitted from speakers 61L and 61R. Audio amplifier 10 is provided with a plurality of sound input terminals (which will hereinafter be referred to as "input terminals"). Each of the input terminals is an L-R terminal pair. Input selector 15 switches an input destination for a sound signal to one of the input terminals. For example, the plurality of input terminals are connected to sound reproducer 41, sound reproducer 42, and the AV selector, respectively. In such a case, input selector 15 serves as an operating member that switches a sound input destination to one of sound reproducer 41, sound reproducer 42, and AV selector 50. Volume-control knob 13 is an operating member that is turned by a user to set a sound volume. Display 17 is a device that displays various pieces of information, such as a sound volume. Display 17 is composed of a liquid crystal device, an organic electro luminescence (EL) device, or the like.

Figure 2:
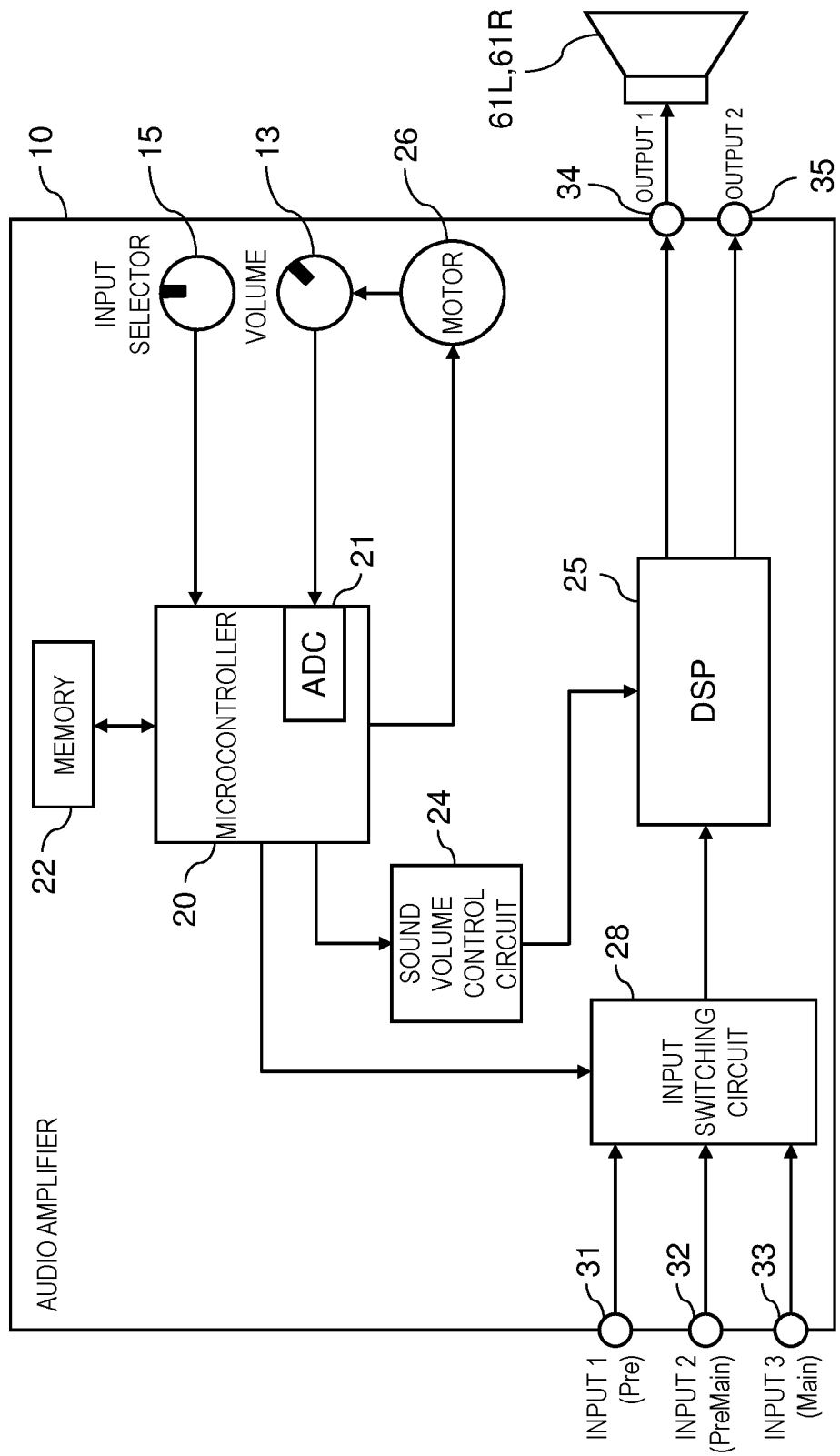
FIG. 2 is a block diagram of an audio amplifier.

FIG. 2 is a block diagram of an internal configuration of audio amplifier 10. FIG. 2 mainly depicts a configuration related to a sound volume adjusting function of audio amplifier 10.

Audio amplifier 10 includes microcontroller 20, memory 22, sound volume control circuit 24, digital signal processor (DSP) 25, input switching circuit 28, and motor 26.

Microcontroller 20 is an example of a controller. Microcontroller 20 carries out various controls over operations of audio amplifier 10. Microcontroller 20 receives incoming signals corresponding to user operations, the signals coming from input selector 15 and volume-control knob 13. Microcontroller 20 has an analog-to-digital (AD) converter 21 incorporated therein.

Memory 22 is a non-volatile memory that stores sound volume setting information created by volume-control knob 13. This memory is, for example, a flash memory. Sound volume control circuit 24 outputs a signal related to volume setting.

DSP 25 is an example of a signal processing circuit. DSP 25 is a circuit that carries out given sound processing, such as amplification, equalizing, and left/right balance adjustment, on an incoming sound signal. DSP 25 includes an AD converter, a signal processing circuit, and a digital-to-analog (DA) converter.

Input switching circuit 28 selects one of input terminals 31, 32, 33 to connect the selected input terminal to DSP 25. Each of input terminals 31, 32, 33 is the L-R terminal pair. Output ends of DSP 25 are connected to output terminals 34, 35, respectively. Following control by the controller, motor 26 causes volume-control knob 13 to turn.

Audio amplifier 10 includes input terminals 31 to 33 for inputting sound signals from the sound sources, and output terminals 34, 35 for outputting sound signals to external equipment.

Input terminal 31 is a terminal to which a sound signal to be processed in audio amplifier 10 is input when audio amplifier 10 is caused to operate as the pre-amplifier. Input terminal 32 is a terminal to which a sound signal to be processed in audio amplifier 10 is input when audio amplifier 10 is caused to operate as the pre-main amplifier. Input terminal 33 is a terminal to which a sound signal to be processed in audio amplifier 10 is input when audio amplifier 10 is caused to operate as the main amplifier. According to this exemplary embodiment, sound reproducer 41 is connected to input terminal 31, sound reproducer 42 is connected to input terminal 32, and an output end of AV selector 50 is connected to input terminal 33.

As described above, audio amplifier 10 according to this exemplary embodiment can function as the pre-amplifier, the main amplifier, and the pre-main amplifier. The function of audio amplifier 10 as one of these amplifiers is switched according to selection made by input selector 15. Specifically, when input selector 15 selects input terminal 31, audio amplifier 10 operates as the pre-amplifier. When input selector 15 selects input terminal 32, audio amplifier 10 operates as the pre-main amplifier. When input selector 15 selects input terminal 33, audio amplifier 10 operates as the main amplifier.

Output terminal 34 is a terminal from which a sound signal is output to speakers 61L, 61R. Output terminal 35 is a terminal from which, when audio amplifier 10 operates as the pre-amplifier, a sound signal is output to the main amplifier located at a next stage.

In actual applications, a pair of terminals are needed as input terminals to input sound signals for an L channel and an R channel. In FIG. 2, however, input terminals 31 to 33 are each depicted as a single terminal for simpler description. Likewise, a pair of terminals are needed as output terminals to output sound signals for the L channel and the R channel. In FIG. 2, however, output terminals 34, 35 are each depicted as a single terminal for simpler description.

[1-2. Operation]

Operations of audio system 100 configured in the above manner will hereinafter be described.

(1) When Audio Amplifier 10 Operates as the Pre-Amplifier (Pre-Amplifier Function)

An operation of audio system 100 in a case where audio amplifier 10 functions as the pre-amplifier will be described.

In this case, audio amplifier 10 carries out a signal-amplifying process on a sound signal from sound reproducer 41 that is input to audio amplifier 10 via input terminal 31. In addition to signal amplifying, audio amplifier 10 also carries out control of a low sound range, a middle sound range, and a high sound range, adjustment of acoustic balance between left and right, and the like, according to a user operation. Audio amplifier 10 outputs an amplified sound signal to an external amplification device (not depicted) operating as the main amplifier, via output terminal 35. This external amplification device amplifies the incoming sound signal from audio amplifier 10 in terms of power, thereby drives the speaker. At this time, a sound volume of a sound finally emitted from the speaker is adjusted by audio amplifier 10. Specifically, audio amplifier 10 changes a size of the sound signal to be output, according to an operation of volume-control knob 13.

(2) when Audio Amplifier 10 Operates as the Pre-Main Amplifier (Pre-Main Amplifier Function)

An operation of audio system 100 in a case where audio amplifier 10 functions as the pre-main amplifier will be described.

In this case, audio amplifier 10 carries out a signal-amplifying process and a power amplifying process on a sound signal from sound reproducer 42 that is input to audio amplifier 10 via input terminal 32. In addition to signal amplifying, audio amplifier 10 also carries out control of a low sound range, a middle sound range, and a high sound range (i.e., sound equalizing), adjustment of acoustic balance between left and right, and the like, according to a user operation. Audio amplifier 10 outputs an amplified sound signal to speakers 61L, 61R. A sound volume of a sound emitted from speakers 61L, 61R is adjusted by audio amplifier 10. Audio amplifier 10 changes a size of the sound signal to be output, according to an operation of volume-control knob 13.

(3) When Audio Amplifier 10 Operates as the Main Amplifier (Main Amplifier Function)

An operation of audio system 100 in a case where audio amplifier 10 functions as the main amplifier will be described.

For example, in audio system 100 shown in FIG. 1, AV selector 50 and audio amplifier 10 may operate as the pre-amplifier and the main amplifier, respectively. In this case, audio amplifier 10 receives an incoming sound signal from AV selector 50 via input terminal 33, amplifies the incoming sound signal to give it power large enough to drive speakers 61L, 61R, and outputs the amplified sound signal to speakers 61L, 61R. As a result, a sound is emitted from speakers 61L, 61R.

When audio amplifier 10 operates as the main amplifier, audio amplifier 10 is configured to turn its sound volume adjusting function off. In other words, when audio amplifier 10 operates as the main amplifier, audio amplifier 10 carries out signal amplification of a sound signal at a fixed amplification factor (e.g., a maximum amplification factor).

For this reason, when audio amplifier 10 operates as the main amplifier, manipulating volume-control knob 13 of audio amplifier 10 does not change a sound volume of a sound finally emitted from speakers 61L, 61R. At this time, the sound volume is adjusted by a device functioning as the pre-amplifier, that is, volume-control knob 53 of AV selector 50.

[1-2-1. Sound Volume Control Carried Out at Time of Amplifier Function Switching]

As described above, audio amplifier 10 according to this exemplary embodiment can be switched in function to the pre-amplifier, the pre-main amplifier, or the main amplifier and operate as such an amplifier. The inventors of the present invention have found that switching an amplifier function of the amplification device may cause the following problem with the sound volume of the sound emitted from the speakers.

When audio amplifier 10 operates as the pre-amplifier or pre-main amplifier, the sound volume of the sound emitted from the speakers is adjusted according to an operation of volume-control knob 13 of audio amplifier 10. When audio amplifier 10 operates as the pre-amplifier or pre-main amplifier, therefore, the user turns volume-control knob 13 to some extent to set it at a turned position so that a sound with a desired sound volume is emitted from the speakers.

In this state, when audio amplifier 10 has been switched to the mode in which audio amplifier 10 operates as the main amplifier, the sound volume of the sound finally emitted from the speakers is adjusted not by audio amplifier 10 but by a device (e.g., AV selector 50) functioning as the pre-amplifier located at a preceding stage to audio amplifier 10. In other words, audio amplifier 10 does not control the sound volume. When the user operates volume-control knob 13 of audio amplifier 10, therefore, it does not change the volume of the sound finally emitted from speakers.

Afterward, when audio amplifier 10 has been switched from the mode in which audio amplifier 10 operates as the main amplifier to the mode in which audio amplifier 10 operates as the pre-amplifier or the pre-main amplifier, a sound with a sound volume corresponding to a position of volume-control knob 13 of audio amplifier 10 is emitted from the speakers.

If the position of volume-control knob 13 of audio amplifier 10 has been shifted in a direction of increasing the sound volume in a period in which audio amplifier 10 operates as the main amplifier, therefore, switching audio amplifier 10 to the mode in which audio amplifier 10 operates as the pre-amplifier or the pre-main amplifier results in emission of a sound with an unintended large sound volume from the speakers.

Figure 3:
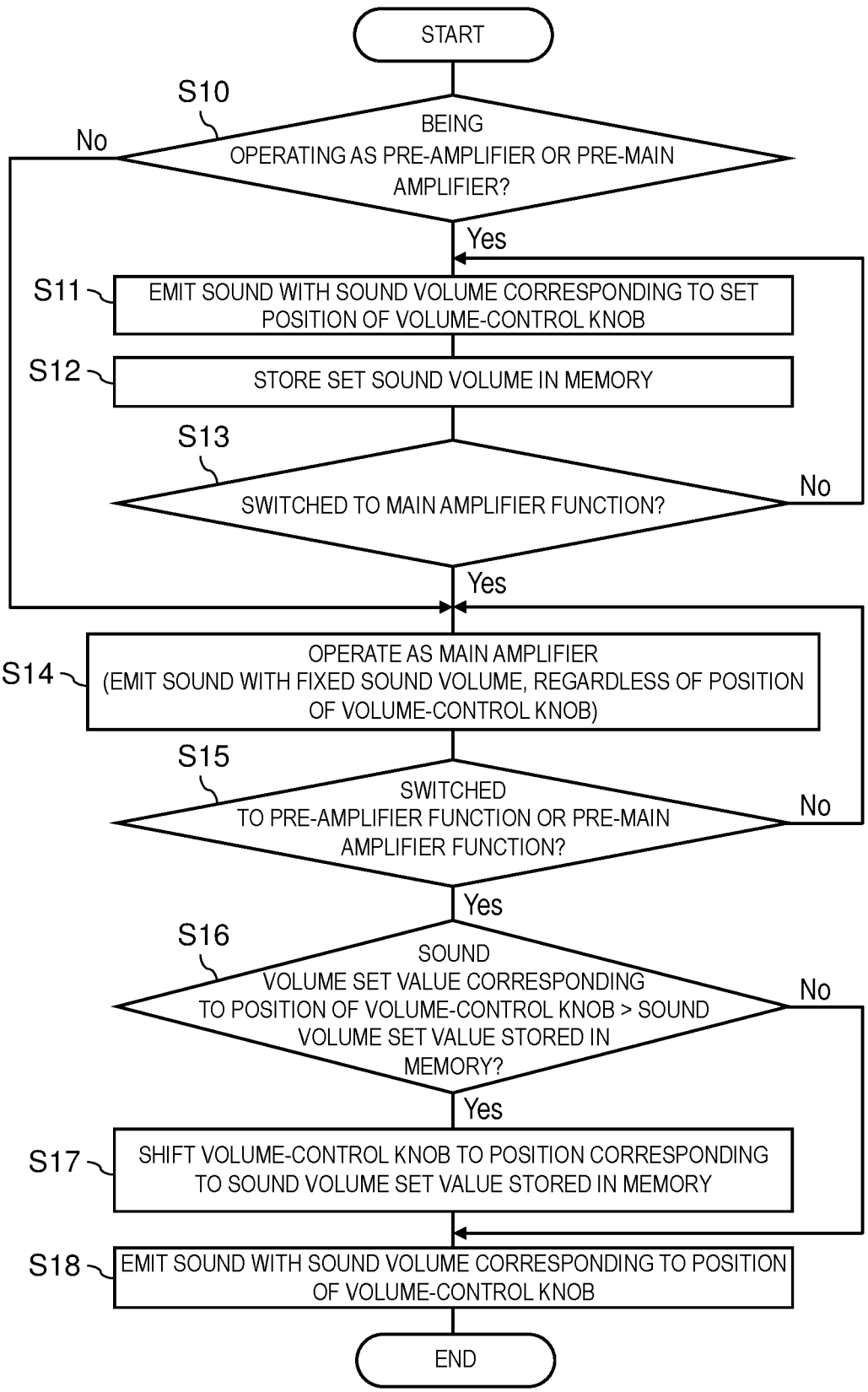
FIG. 3 is a flowchart showing an operation that is carried out by the audio amplifier when its amplifier function is switched.

To prevent emission of such a sound with an unintended large sound volume, audio amplifier 10 according to this exemplary embodiment carries out control depicted in a flowchart of FIG. 3. FIG. 3 is a flowchart showing an operation that is carried out when an amplifier function of audio amplifier 10 is switched. The operation depicted in the flowchart of FIG. 3 is executed by microcontroller 20 of audio amplifier 10 and is executed regularly at given cycles.

First, microcontroller 20 of audio amplifier 10 determines whether audio amplifier 10 is operating as the pre-amplifier or pre-main amplifier (S10). Microcontroller 20 makes this determination based on a setting signal from input selector 15.

When audio amplifier 10 is operating as the main amplifier (No at S10), the control flow proceeds to step S14 (which will be described in detail later).

When audio amplifier 10 is operating as the pre-amplifier or pre-main amplifier (Yes at S10), microcontroller 20 controls audio amplifier 10 so that a sound with a volume corresponding to a set position of volume-control knob 13 is emitted (S11). Microcontroller 20 stores information indicating a set value for a sound volume (which will hereinafter be referred to as "sound volume set value") corresponding to a position of volume-control knob 13 at this point of time, in memory 22 (S12). The sound volume set value stored in memory 22 at step S12 is, for example, a set value corresponding to a first sound volume according to the present disclosure.

The above steps (S11, S12) are repeated until the function of audio amplifier 10 is switched to the main amplifier function (No at S13).

When the function of audio amplifier 10 is switched to the main amplifier function (Yes at S13), microcontroller 20 causes audio amplifier 10 to operate as the main amplifier (S14). At this time, microcontroller 20 turns off the sound volume adjusting function of audio amplifier 10. Microcontroller 20 thus prevents audio amplifier 10 from changing the sound volume even when the position of volume-control knob 13 is changed. In other words, microcontroller 20 amplifies a sound signal at a fixed amplification factor, regardless of the position of volume-control knob 13. In this case, equipment located at the preceding stage to audio amplifier 10 and operating as the pre-amplifier performs sound volume adjustment.

Afterward, microcontroller 20 determines whether the function of audio amplifier 10 has been switched to the pre-amplifier function or the pre-main amplifier function (S15). Audio amplifier 10 keeps operating as the main amplifier (S14) until the function of audio amplifier 10 is switched to the pre-amplifier function or the pre-main amplifier function (No at S15).

When the function of audio amplifier 10 has been switched to the pre-amplifier function or the pre-main amplifier function (Yes at S15), microcontroller 20 compares a sound volume set value corresponding to a position of volume-control knob 13 at the current point of time with the sound volume set value that was stored in memory 22 right before switching to the main amplifier function (S16).

When the sound volume set value corresponding to the position of volume-control knob 13 at the current point of time is larger than the sound volume set value stored in memory 22 (Yes at S16), microcontroller 20 adjusts the position of volume-control knob 13 to a position corresponding to the sound volume set value that was stored in memory 22 right before switching to the main amplifier function (S17). Specifically, microcontroller 20 reads the sound volume set value stored in memory 22 right before switching to the main amplifier function, from memory 22, and drives motor 26 according to the position corresponding to the read sound volume set value. Microcontroller 20 thus causes volume-control knob 13 to shift to the position at which volume-control knob 13 was set right before switching to the main amplifier function (in this exemplary embodiment, microcontroller 20 causes volume-control knob 13 to turn to the position). The sound volume set value corresponding to the position of volume-control knob 13 at the point of time at which Yes results at step S16 is a set value corresponding to a second sound volume according to the present disclosure. The sound volume set value stored in memory 22 at the point of time at which Yes results at step S16 is a set value corresponding to the first sound volume according to the present disclosure. At step S17, a sound volume corresponding to the adjusted position of volume-control knob 13 is equivalent to a third sound volume according to the present disclosure. According to this exemplary embodiment, the third sound volume is determined to be equal to the first sound volume.

Now, when the sound volume set value corresponding to the position of volume-control knob 13 at the current point of time is not larger than the sound volume set value stored in memory 22 (No at S16), microcontroller 20 does not cause volume-control knob 13 to shift.

The sound volume set value corresponding to the position of volume-control knob 13 at the point of time at which No results at step S16 is a set value corresponding to a fourth sound volume according to the present disclosure. The sound volume set value stored in memory 22 at the point of time at which No results at step S16 is a set value corresponding to a set value for the first sound volume according to the present disclosure.

Afterward, microcontroller 20 carries out control so that a sound with a sound volume corresponding to the position of volume-control knob 13, that is, the third or fourth sound is emitted (S18). Specifically, microcontroller 20 outputs a sound volume set value corresponding to the position of volume-control knob 13, to sound volume control circuit 24. Based on the sound volume set value, sound volume control circuit 24 outputs an instruction indicating sound volume setting, to DSP 25. DSP 25 amplifies a sound signal so as to achieve a sound volume based on the sound volume set value, and outputs the amplified sound signal to speakers 61L, 61R via output terminal 34.

As described above, according to audio amplifier 10 of this exemplary embodiment, when the amplifier function of audio amplifier 10 is switched from the main amplifier function to the pre-amplifier function or the pre-main amplifier function and a sound volume at this point of time becomes larger than a sound volume at the previous point of time at which the the pre-amplifier function or the pre-main amplifier function was executed, audio amplifier 10 changes the position of volume-control knob 13 to a position at which volume-control knob 13 reduces the sound volume. For example, audio amplifier 10 shifts volume-control knob 13 back to the position at which volume-control knob 13 was set right before switching to the main amplifier function, that is, the position at which the user set volume-control knob 13 intentionally at the previous point of time of execution of the pre-amplifier function or pre-main amplifier function. Thus, when the amplifier function of audio amplifier 10 is switched from the main amplifier function to the pre-amplifier function or the pre-main amplifier function, emission of a sound with an unintended large sound volume can be prevented.

[1-2-2. Determining Sound Volume Set Value]

A position of volume-control knob 13 is indicated by an analog signal (e.g., analog voltage). This analog signal is input to microcontroller 20. Microcontroller 20 causes AD converter 21 to convert the incoming analog signal to a digital value (which will hereinafter be referred to as "A/D value"). Based on the A/D value, microcontroller 20 then determines a sound volume set value.

FIG. 4 depicts an example of a determination table for determining a sound volume set value from an A/D value. On the determination table, the entire range in which the A/D value varies is divided into a plurality of ranges and each of the divided ranges is managed as STEP. In FIG. 4, the entire range in which the A/D value varies is divided into 102 ranges (STEPs), and STEPs 0 to 100 are assigned to 101 ranges out of 102 ranges, respectively. To STEPs 0 to 100, sound volume set values (Vol) 0 to 100 are then assigned, respectively.

Microcontroller 20 refers to the table of FIG. 4 to determine an A/D value, and based on the determined A/D value, identifies a STEP corresponding to the A/D value. For example, when the A/D value is "105", the A/D value "105" is within a range corresponding to STEP 9. Microcontroller 20 thus identifies STEP 9 as a STEP corresponding to the A/D value "105". In another case where the A/D value is "475", STEP 46 is identified.

Referring to the table of FIG. 4, microcontroller 20 determines a sound volume set value based on an identified STEP. For example, when the identified STEP is STEP 9, microcontroller 20 determines the sound volume set value (Vol) to be "9", referring to the table of FIG. 4. For example, when the identified STEP is STEP 46, microcontroller 20 determines the sound volume set value (Vol) to be "46", referring to the table of FIG. 4.

In the above manner, a sound volume set value is determined in correspondence to a position of volume-control knob 13. Now a case is assumed where the A/D value changes due to a slight shift of volume-control knob 13, noise, or the like. In such a case, if the A/D value is close to a boundary to a STEP, fluctuations in the A/D value may result in frequent changes of the sound volume set value. To solve such a problem, according to this exemplary embodiment, boundaries to an A/D value range (i.e., an upper limit and a lower limit of an A/D value range) assigned to each STEP are changed according to a direction of change of sound volume setting. This process of changing boundaries to an A/D value range will hereinafter be referred to as hysteresis process. An A/D value range assigned to each STEP is referred to as determination range for each STEP. The hysteresis process will be described with reference to FIG. 5.

Figure 5:
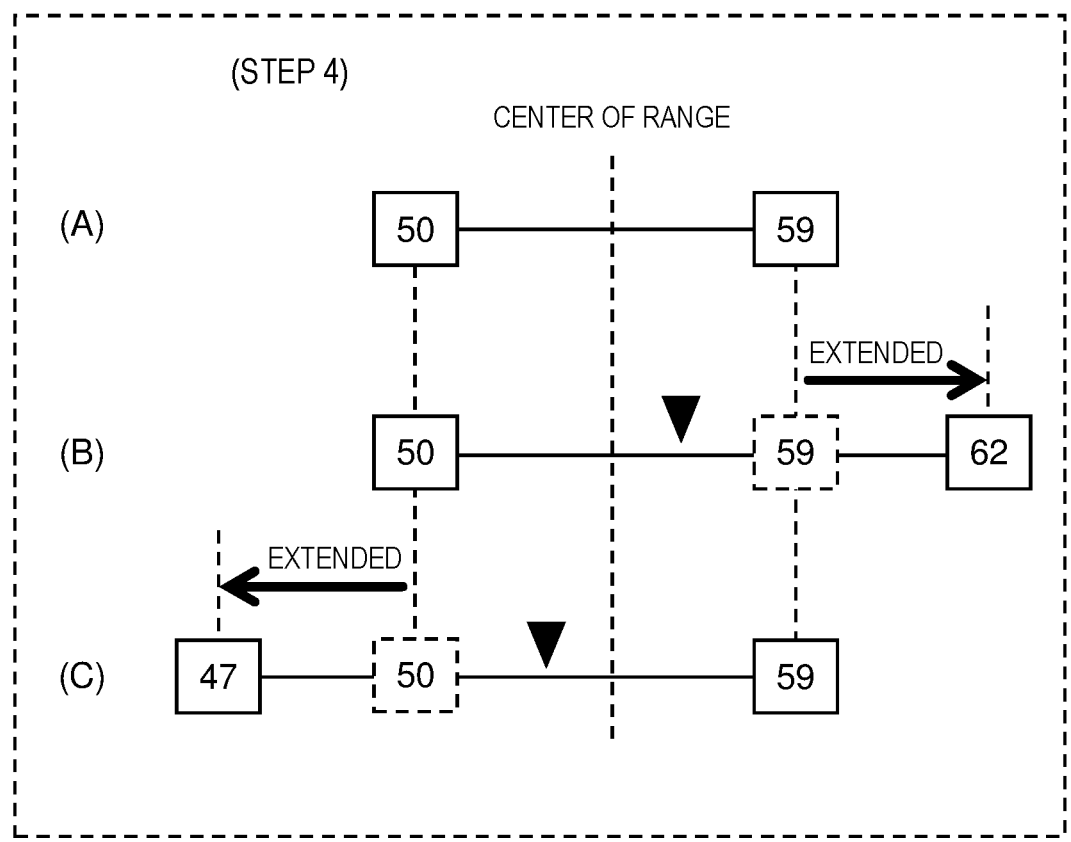
FIG. 5 is a diagram for explaining hysteresis to an A/D value range.

In (A) of FIG. 5, for example, boundaries to an A/D value range assigned to STEP 4 (i.e., a determination range for step 4) is considered. The determination range for step 4 is basically (in other words, initially) a range in which the A/D value ranges from 50 to 59 (see FIG. 4). Microcontroller 20 changes boundaries to an A/D value range assigned to a STEP, according to a direction of change of sound volume setting. Specifically, when finding that a detected A/D value is larger than a central value of an A/D value range assigned to a STEP corresponding to the detected A/D value (in the case of FIG. 5, the central value is 54.5), microcontroller 20 shifts an upper limit of the determination range by +3, as shown in (B) of FIG. 5. When finding that the detected A/D value is smaller than the central value, microcontroller 20 shifts a lower limit of the determination range by 3, as shown in (C) of FIG. 5. In this manner, microcontroller 20 shifts boundaries to the determination range for the STEP corresponding to the detected A/D value, that is, shifts at least one of the upper limit and the lower limit of the determination range. Thus, when the detected A/D value (i.e., sound volume set value) changes from a high value to a low value, the lower limit of the determination range for the STEP corresponding to the A/D value is extended. When the detected A/D value (i.e., sound volume set value) changes from a low value to a high value, on the other hand, the upper limit of the determination range for the STEP corresponding to the A/D value is extended.

In the above manner, according to this exemplary embodiment, the hysteresis process of shifting boundaries to a determination range for a STEP is carried out.

FIG. 6 is a diagram for explaining the hysteresis process that is carried out when volume-control knob 13 is operated to reduce the sound volume. FIG. 6 depicts an example of the hysteresis process that is carried out when the user operates volume-control knob 13 to shift it from a position corresponding to an A/D value "43" to a position corresponding to an A/D value "26".

As shown in (A) of FIG. 6, when the A/D value is "43" at the start of the process, STEP 3 is identified on the table of FIG. 4, as a STEP corresponding to the detected A/D value "43". A determination range for STEP 3 is "40 to 49", and the central value of this determination range is "45". At this point of time, the detected A/D value "43" is smaller than a central value "45" of the determination range for STEP 3 corresponding to the A/D value "43". As a result, a lower limit "40" of the determination range for STEP 3 is extended by 3 into "37". The determination range for STEP 3 is thus redefined as "37 to 49".

In this state, operating volume-control knob 13 to reduce the sound volume causes the detected A/D value "43" to decrease. When the A/D value keeps decreasing to become smaller than the lower limit "37", STEP corresponding to the detected A/D value is switched from STEP 3 to STEP 2, as shown in (B) of FIG. 6. It is assumed that the detected A/D value at this point of time is "36". A determination range for STEP 2 is "30 to 39", and a central value of this determination range is "35". The A/D value "36" detected at the point of time indicated by (B) of FIG. 6 is therefore larger than the central value "35" of the determination range for STEP 2. As a result, the upper limit "39" of the determination range for STEP 2 is extended by +3 to redefine the determination range for STEP 2 as "30 to 42". This means that because the upper limit of the determination range for STEP 2 is extended, the detected A/D value is kept within the determination range for STEP 2 even if the detected A/D value shifts slightly in a direction in which it increases. This prevents frequent changes in a STEP to be determined.

In this state, when volume-control knob 13 is operated to further reduce the sound volume and consequently the A/D value decreases to become smaller than the central value "35", the upper limit of the determination range for STEP 2 is readjusted back to "39", which is a reference value, while the lower limit of the same is extended by 3, as shown in (C) of FIG. 6. The determination range for STEP 2 is thus redefined as "27 to 39".

In this state, operating volume-control knob 13 to further reduce the sound volume causes the A/D value to decrease to "26". Because the A/D value "26" is smaller than the lower limit of the determination range for STEP 2, STEP corresponding to the A/D value "26" is switched from STEP 2 to STEP 1, as shown in (D) of FIG. 6. At this point of time, an upper limit of a determination range for STEP 1 is extended by +3. As a result, the A/D value is kept within the determination range for STEP 1 even if the A/D value shifts slightly in a direction in which it increases. This prevents frequent changes in a STEP to be determined.

FIG. 7 is a diagram for explaining the hysteresis process that is carried out when volume-control knob 13 is operated to increase the sound volume. FIG. 7 depicts an example of the hysteresis process that is carried out when the user operates volume-control knob 13 to shift it from a position corresponding to an A/D value "36" to a position corresponding to an A/D value "53".

As shown in (A) of FIG. 7, when the A/D value is "36" at the start of the process, STEP 2 is identified on the table of FIG. 4, as a STEP corresponding to the A/D value "36". At this point of time, the A/D value "36" is larger than the central value "35" of the determination range for STEP 2. As a result, the upper limit "39" of the determination range for STEP 2 is extended by +3 into "42". The determination range for STEP 2 is thus redefined as "30 to 42".

In this state, operating volume-control knob 13 to increase the sound volume causes the detected A/D value "36" to increase. When the A/D value keeps increasing to become larger than the upper limit "42", STEP corresponding to the A/D value is switched from STEP 2 to STEP 3, as shown in (B) of FIG. 7. At this point of time, the lower limit "40" of the determination range for STEP 3 is extended by 3 to redefine the determination range for STEP 3 as "37 to 49". Because the lower limit of the determination range for STEP 3 is extended in this manner, the A/D value is kept within the determination range for STEP 3 even if the A/D value shifts slightly in a direction in which it decreases. This prevents frequent changes in a STEP to be determined.

In this state, when volume-control knob 13 is operated to further increase the sound volume and consequently the A/D value increases to become larger than the central value "45" of the determination range for STEP 3, the lower limit of the determination range for STEP 3 is readjusted back to "40", which is a reference value, while the upper limit of the same is extended by +3, as shown in (C) of FIG. 7. The determination range for STEP 3 is thus redefined as "40 to 52".

In this state, operating volume-control knob 13 to further increase the sound volume causes the A/D value to increase to "53". Because the A/D value "53" is larger than the upper limit "52" of the determination range for STEP 3, STEP corresponding to the A/D value "53" is switched from STEP 3 to STEP 4, as shown in (D) of FIG. 7. At this point of time, a lower limit of a determination range for STEP 4 is extended by 3. As a result, the A/D value is kept within the determination range for STEP 4 even if the A/D value shifts slightly in a direction in which it decreases. Frequent changes in a STEP to be determined is therefore prevented.

As described above, carrying out the hysteresis process reduces cases where when a detected A/D value is close to a boundary between adjacent STEPs, a sound volume set value changes frequently.

The above described hysteresis process of shifting boundaries to a determination range is carried out at given points of time.

An example of the given points of time is a point of time at which a detected A/D value enters a new determination range (i.e., determination range for a new STEP).

Given points of time also include a point of time at which it is determined that an operation of volume-control knob 13 has been stopped. When an amount of a change in the detected A/D value is equal to or smaller than a given value, it is determined that the operation of volume-control knob 13 has been stopped. For example, when a difference between an A/D value detected at the current point of time and an A/D value detected at the previous point of time is equal to or smaller than the given value, it is determined that the operation of volume-control knob 13 has been stopped. When a difference between an A/D value detected at the current point of time and an average of a given number of A/D values detected in the past is equal to or smaller than the given value, it may also be determined that the operation of volume-control knob 13 has been stopped. In this manner, the hysteresis process is carried out when it is determined that an operation of volume-control knob 13 has been stopped. By carrying out the hysteresis process in this manner, a change in a sound volume set value caused by the influence of noise can be suppressed when volume-control knob 13 stops at a boundary to a determination range. For example, when the user has finished with operating volume-control knob 13 but volume-control knob 13 shifts further due to inertia momentum, a sound volume set value is determined at a position at which volume-control knob 13 is stopped intentionally by the user. Hence a change in the sound volume set value is suppressed. When a sound volume set value is displayed on display 17, in particular, if the sound volume set value displayed on display 17 changes despite the user's having stopped operating volume-control knob 13, the user gets confused. However, in the above manner, by carrying out the hysteresis process when it is determined that the operation of volume-control knob 13 has been stopped, such problematic cases are reduced.

[1-3. Effects]

As described above, audio amplifier 10 according to this exemplary embodiment is an amplification device configured to switch between the pre-amplifier function or the pre-main amplifier function (example of a first amplifier function) that allows sound volume adjustment and the main amplifier function (example of a second amplifier function) that does not allow sound volume adjustment. Audio amplifier 10 includes input terminals 31 to 33 to which sound signals are input, volume-control knob 13 (example of an operating member) operated by the user to set a sound volume, memory 22 (example of a storage unit) that stores therein a sound volume set value set by volume-control knob 13, DSP 25 (example of a signal processing circuit) that amplifies a sound signal input to DSP 25 via an input terminal so that the sound volume set by volume-control knob 13 can be obtained, and microcontroller 20 that controls DSP 25.

During execution of the pre-amplifier function or the pre-main amplifier function, microcontroller 20 controls an amplifying operation of DSP 25 so that the sound volume set by volume-control knob 13 can be obtained. Microcontroller 20 stores the sound volume set value set by volume-control knob 13, in memory 22.

When the pre-amplifier function or the pre-main amplifier function is switched to the main amplifier function and then the main amplifier function is switched to the pre-amplifier function or the pre-main amplifier function, microcontroller 20 changes a state of volume-control knob 13 back to a state corresponding to the sound volume set value that was stored in memory 22 right before switching from the pre-amplifier function or the pre-main amplifier function to the main amplifier function, according to a given condition. Microcontroller 20 controls an amplifying operation of DSP 25 so that a sound volume corresponding to the sound volume set value stored in memory 22 right before the switching is obtained. For example, when the main amplifier function is switched to the pre-amplifier function or the pre-main amplifier function and at that time a sound volume set value corresponding to a position of volume-control knob 13 (i.e., a set value for the second sound volume) is larger than a sound volume set value stored in memory 22 (i.e., a set value for the first sound volume), microcontroller 20 controls the sound volume according to the sound volume set value stored in memory 22. When a sound volume set value corresponding to a position of volume-control knob 13 (i.e., a set value for the fourth sound volume) is smaller than the sound volume set value stored in memory 22 or is equal to or smaller than the sound volume set value stored in memory 22, microcontroller 20 carries out sound volume control so that a sound volume corresponding to the position of volume-control knob 13, that is, the fourth sound volume can be obtained.

By controlling the state of volume-control knob 13 in the above manner, when the main amplifier function is switched to the pre-amplifier function or the pre-main amplifier function, volume-control knob 13 is brought into the state in which volume-control knob 13 is set before switching to the main amplifier function. As a result, even if volume-control knob 13 is operated during execution of the main amplifier function, emission of an unintended large sound can be prevented.

Audio amplifier 10 further includes AD converter 21 that converts an analog value set by volume-control knob 13 into a digital value (A/D value). Microcontroller 20 associates the digital value with a given determination range equivalent to a STEP and coverts the digital value into a sound volume set value corresponding to the STEP (see FIG. 4). Microcontroller 20 shifts an upper limit or a lower limit of the determination range according to a direction in which the detected digital value changes, that is, carries out the hysteresis process on the determination range. Microcontroller 20 shifts the upper limit or the lower limit of the determination range when the user's operation of sound volume adjustment stops. In this manner, by carrying out the hysteresis process when the operation of sound volume adjustment stops, a change in a sound volume caused by the influence of noise can be suppressed when volume-control knob 13 stops at a boundary to the determination range.

Other Exemplary Embodiments

The first exemplary embodiment has been described above as an example of the technique disclosed in the present application. However, the technique in the present disclosure is not limited to this, and can also be applied to exemplary embodiments subjected to changes, replacements, additions, omissions, and the like in a proper manner. It is also possible that constituent elements described in the above first exemplary embodiment are combined to create a new exemplary embodiment. Now, other exemplary embodiments will hereinafter be described.

According to the first exemplary embodiment, audio amplifier 10 has both the pre-amplifier function and the pre-main amplifier function as the first amplifier function. However, audio amplifier 10 may have either the pre-amplifier function or the pre-main amplifier function only as the first amplifier function.

According to the first exemplary embodiment, when the amplifier function of audio amplifier 10 is switched from the main amplifier function to the pre-amplifier function or the pre-main amplifier function and a sound volume set value set by volume-control knob 13 is larger than a sound volume set value stored in memory 22, a position of volume-control knob 13 is changed back to a position at which volume-control knob 13 was set right before switching to the main amplifier function. However, the position of volume-control knob 13 does not always need to be changed back to the position at which volume-control knob 13 was set right before switching to the main amplifier function. For example, the position of volume-control knob 13 may be changed back to a given position at which a sound volume (third sound volume according to the present disclosure) smaller than a sound volume created by volume-control knob 13 set at the current position at the current point of time (second sound volume according to the present disclosure) can be obtained. The third sound volume may not be equal to the sound volume stored in memory 22 (i.e., first sound volume according to the present disclosure) and may be larger or smaller than the first sound volume.

According to the first exemplary embodiment, when the amplifier function of audio amplifier 10 is switched from the main amplifier function to the pre-amplifier function or the pre-main amplifier function, a sound volume set value set by volume-control knob 13 is compared with a sound volume set value stored in memory 22 and, based on a result of the comparison, a position of volume-control knob 13 is controlled. However, when the amplifier function of audio amplifier 10 is switched from the main amplifier function to the pre-amplifier function or the pre-main amplifier function, the position of volume-control knob 13 may be changed back unconditionally to the position at which volume-control knob 13 was set right before switching to the main amplifier function.

According to the first exemplary embodiment, when the amplifier function of audio amplifier 10 is switched from the main amplifier function to the pre-amplifier function or the pre-main amplifier function and a sound volume set value corresponding to a position of volume-control knob 13 (i.e., a set value for the fourth sound volume) is found smaller than the sound volume set value stored in memory 22 or equal to or smaller than the sound volume set value stored in memory 22, microcontroller 20 does not change the position of volume-control knob 13 and carries out sound volume control so that a sound volume corresponding to the position of volume-control knob 13, that is, the fourth sound volume can be obtained. In this configuration, right after the main amplifier function is switched to the pre-amplifier function or the pre-main amplifier function, a sound with a small sound volume can be emitted according to the user's intention. For example, right before switching from the main amplifier function to the pre-amplifier function or the pre-main amplifier function, the user may operate the volume-control knob to intentionally reduce the sound volume in a cautious approach for preventing emission of a large sound. This exemplary embodiment allows the user to achieve the above-described user's intention. However, the present disclosure is not limited to such a configuration. For example, audio amplifier 100 may be configured to operate such that even when the fourth sound volume is smaller than the sound volume stored in the memory (i.e., first sound volume), audio amplifier 100 changes the position of volume-control knob 13 to emit a sound with a given sound volume. The given sound volume may be, for example, equal to the first sound volume or may be larger or smaller than the first sound volume.

On audio amplifier 10, when the user operates input selector 15 to select one of sound reproducer 41, sound reproducer 42, and AV selector 50 as an input origin, a sound volume set value for each of sound reproducer 41, sound reproducer 42, and AV selector 50 serving respectively as input origins may be stored in memory 22. Afterward, every time input selector 15 is operated for input origin switching, microcontroller 20 may read a sound volume set value for a selected input origin out of memory 22 and control volume-control knob 13 to set it at a position corresponding to the read sound volume set value, that is, reset a sound volume set value back to the sound volume set value corresponding to the selected input origin.

According to the first exemplary embodiment, when the main amplifier function is switched to the pre-amplifier function or the pre-main amplifier function, microcontroller 20 controls the position of volume-control knob 13 based on setting stored in memory 22, without checking with the user on a sound volume to which the user intends to reset the current sound volume back. However, when the main amplifier function is switched to the pre-amplifier function or the pre-main amplifier function, microcontroller 20 may check with the user on a sound volume to which the user intends to reset the current sound volume back. Specifically, when switching the amplifier function, audio amplifier 10 may cause the display to display a sound volume set value to which the user intends to reset the current sound volume set value back and, in such a condition, allow the user to operate volume-control knob 13 to set the sound volume set value to which the user intends to reset the current sound volume set value back.

According to the first exemplary embodiment, an example of the volume-control knob that is turned for sound volume setting is indicated as an operating member for sound volume setting. The operating member is not limited to such a volume-control knob, and may be, for example, a member that is slid to make sound volume setting or a member provided as a touch panel for sound volume setting.

According to the first exemplary embodiment, a state of the operating member refers to a rotation angle of the operating member. When the operating member is slid for sound volume setting, however, a state of the operating member may refer to a position of the operating member. When the operating member is provided as a touch panel, a state of the operating member may refer to display made by the operating member.

In the first exemplary embodiment, a method of the hysteresis process on an A/D value range for determining a sound volume set value (STEP) has been described. Execution of the hysteresis process is, however, is not limited to the above method. For example, an extent of shifting a boundary to the A/D value range is not limited to 3. According to the first exemplary embodiment, which of the upper limit and the lower limit of the A/D value range is to be shifted is determined based on the central value of the A/D value range as the reference value. A method of shifting the upper limit or the lower limit, however, is not limited to this. For example, another method may be adopted, according to which a difference between a detected A/D value and an upper limit of an A/D value range and a difference between the detected A/D value and a lower limit of the A/D value range are checked and a boundary to either the upper limit or the lower limit with which the A/D value has a difference of a given value or less is shifted.

The number of input terminals and output terminals included in the amplification device (audio amplifier 10) is not limited to the number described in the above exemplary embodiment.

According to the first exemplary embodiment, the microcontroller is described as an example of the controller. The controller, however, is not limited to the microcontroller. The DSP is described as an example of the signal processing circuit. The signal processing circuit, however, is not limited to the DSP. The controller and the signal processing circuit can be provided as any given types of semiconductor devices, such as a central processing unit (CPU), a micro processing unit (MPU), a field-programmable gate array (FPGA), and an application specific integrated circuit (ASIC).

The exemplary embodiments have been described above as examples of the technique in the present disclosure. For that purpose, the accompanying drawings and detailed descriptions have been provided.

The constituent elements described in the accompanying drawings and detailed descriptions, therefore, may include not only the constituent elements essential for solving problems but also constituent elements not essential for solving the problems, for the purpose of describing the above technique. It should be noted for this reason that these unessential constituent elements being described in the accompanying drawings and detailed descriptions should not lead immediately to a conclusion that such unessential constituent elements are also essential.

Since the above exemplary embodiments are described as examples of the technique in the present disclosure, the exemplary embodiments may be subjected to various modifications, substitutions, additions and omissions within the scope of claims and a scope equivalent thereto.

INDUSTRIAL APPLICABILITY

The amplification device according to the present disclosure is the amplification device that amplifies sound signals, and is useful as the amplification device configured to switch between the amplifying function that allows sound volume adjustment and the amplifying function that does not allow sound volume adjustment.

The invention claimed is:

1. An amplification device configured to switch between a first amplifying function that allows sound volume adjustment and a second amplifying function that does not allow sound volume adjustment, the amplification device comprising:
   an operating member that receives setting of a sound volume, the operating member having a state changed according to the sound volume;
   a signal processing circuit that amplifies an incoming sound signal so that the sound volume set by the operating member is obtained; and
   a controller that controls the signal processing circuit, wherein
   during execution of the first amplifier function, the controller controls an amplifying operation of the signal processing circuit so that the sound volume set by the operating member can be obtained, and wherein
   when the first amplifier function is switched to the second amplifier function and then the second amplifier function is switched to the first amplifier function and at this time the state of the operating member is the state corresponding to a second sound volume larger than a first sound volume that was output right before switching from the first amplifier function to the second amplifier function, the controller changes the state of the operating member to a state corresponding to a third sound volume smaller than the second sound volume, and controls the amplifying operation of the signal processing circuit to cause the signal processing circuit to output the third sound volume.

2. The amplification device according to claim 1, further comprising a storage unit that stores the sound volume set by the operating member, wherein
   the third sound volume is equal to the first sound volume.

3. The amplification device according to claim 1, wherein
   when the first amplifier function is switched to the second amplifier function and then the second amplifier function is switched to the first amplifier function and at this time the state of the operating member is the state corresponding to a fourth sound volume smaller than the first sound volume, the controller does not change the state of the operating member, and controls the amplifying operation of the signal processing circuit to cause the signal processing circuit to output the fourth sound volume.

4. The amplification device according to claim 1, wherein
   the operating member is configured to have the state changed when turned or slid, wherein
   the amplification device further comprises a driver that causes the operating member to turn or slide, and wherein
   the controller is configured to control the driver to turn or slide the operating member from the state corresponding to the second sound volume to the state corresponding to the third sound volume.

5. The amplification device according to claim 1, further comprising:
   a plurality of input terminals each of which receives the sound signal as an incoming external signal; and
   an input selector operated to select a desired input terminal from the plurality of input terminals, wherein the controller is configured to make switching between the first amplifying function and the second amplifying function according to selection of the desired input terminal by the input selector.

6. The amplification device according to claim 1, wherein the first amplifying function is a function of amplifying the sound signal in terms of signal level and the second amplifying function is a function of amplifying the sound signal in terms of power.

7. The amplification device according to claim 1, further comprising an analog-to-digital converter that converts the sound volume setting received by the operating member into a digital value, wherein
the controller converts the digital value into a set value for the sound volume for each given range, wherein
the controller causes an upper limit or a lower limit of the given range to shift in correspondence to a direction in which the digital value converted into the set value for the sound volume changes, and wherein
when a user's operation of the operating member stops, the controller causes the upper limit or the lower limit of the given range to shift.

\* \* \* \* \*